(12) United States Patent
Nakamura et al.

(10) Patent No.: US 8,136,564 B2
(45) Date of Patent: Mar. 20, 2012

(54) ATTACHING DEVICE AND ATTACHING APPARATUS FOR SUPPORTING PLATE, AND ATTACHING METHOD FOR SUPPORTING PLATE

(75) Inventors: Akihiko Nakamura, Kanagawa (JP); Atsushi Miyanari, Kanagawa (JP); Yoshihiro Inao, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1107 days.

(21) Appl. No.: 11/633,604

(22) Filed: Dec. 4, 2006

(65) Prior Publication Data

US 2007/0125495 A1    Jun. 7, 2007

(30) Foreign Application Priority Data

Dec. 6, 2005   (JP) .................................. 2005-352594

(51) Int. Cl.
*B32B 37/10*    (2006.01)
(52) U.S. Cl. .......................... 156/381; 156/382; 156/538
(58) Field of Classification Search .................. 156/285, 156/286, 382, 378, 381, 538; 438/484, 106, 438/138; 428/848
See application file for complete search history.

(56) References Cited

U.S. PATENT DOCUMENTS

| | | | |
|---|---|---|---|
| 5,106,441 A * | 4/1992 | Brosig et al. ................... | 156/104 |
| 6,830,947 B2 * | 12/2004 | Kamiya et al. ................... | 438/30 |
| 7,242,204 B2 * | 7/2007 | Otaguro et al. ........... | 324/750.19 |
| 2002/0008838 A1 * | 1/2002 | Matsuda ........................ | 349/187 |
| 2003/0054668 A1 * | 3/2003 | Kitano et al. ................. | 438/782 |

FOREIGN PATENT DOCUMENTS

| | | |
|---|---|---|
| JP | 2002-192394 | 7/2002 |
| WO | WO 2005055315 A1 * | 6/2005 |

\* cited by examiner

*Primary Examiner* — Christopher Schatz
(74) *Attorney, Agent, or Firm* — Carrier Blackman & Associates, P.C.; Joseph P. Carrier; William D. Blackman

(57) ABSTRACT

An attaching device which makes it possible to accurately perform alignment when the diameters of a substrate and a supporting plate are substantially the same includes a mounting plate for mounting a semiconductor wafer thereon, a pressing plate for pressing a supporting plate onto the semiconductor wafer, and a pair of alignment members. The pair of alignment members are arranged to freely move back and forth in a horizontal direction, and blades for supporting a lower surface of the periphery of the supporting plate and pushing members for performing positioning in a state where the supporting plate is superposed on the semiconductor wafer are provided at tip ends of the alignment members.

14 Claims, 8 Drawing Sheets

ATTACHING DEVICE AND ATTACHING APPARATUS FOR SUPPORTING PLATE, AND ATTACHING METHOD FOR SUPPORTING PLATE

CROSS-REFERENCE TO RELATED APPLICATIONS

The present application claims priority from Japanese patent application 2005-352594, filed 6 Dec. 2005. The entire disclosure of the referenced priority document is incorporated herein by reference.

BACKGROUND OF THE INVENTION

1. Field of the Invention

The present invention relates to an attaching device and an attaching apparatus for a supporting an attaching method for a supporting plate.

2. Description of the Background Art

There is a continuing need to make IC cards and cell phones thinner, smaller, and lighter. In order to satisfy this need, semiconductor chips to be incorporated therein must be thin. Although at present the thickness of a wafer which forms a semiconductor chip is 125-150 μm, it is expected that the thickness of a semiconductor wafer must be 25-50 μm for a next generation of chips.

A surface of a semiconductor wafer on which a circuit device has been formed needs to be supported by a tape or a sheet member in the process of thinning the semiconductor wafer with a grinder. Document 1 has disclosed an apparatus for attaching a supporting plate to a semiconductor wafer.

The apparatus of Document 1 comprises a pair of hot plates provided in the upper portion and the lower portion, and a pair of vacuum pots provided outside the hot plates, so that a layered structure of a semiconductor wafer and a supporting plate can be formed by pressing in a pressure-reduced atmosphere. Especially, according to Document 1, an air plunger which also functions as a damper is used as a means for elevating and lowering the upper hot plate instead of a hydraulic press, so that a semiconductor wafer is prevented from being damaged by adverse pressure generated when the layered structure expands due to the heat of the hot plate.

[Document 1] Japanese Patent Application Publication No. 2002-192394

Document 1 uses a semiconductor wafer whose diameter is 150 mm, and a supporting plate whose diameter is 150.5 mm. More specifically, a positioning plate in which a hole having a diameter of 160 mm is formed in the center is prepared, and a semiconductor wafer and a supporting plate are inserted into the hole of the positioning plate and attached to each other (paragraph 0024-0028).

As described above, if the diameters of the semiconductor wafer and the supporting plate are almost the same, the layered structure can be handled as the semiconductor wafer alone when it is transferred. However, this technique has a drawback in that displacement occurs because the semiconductor wafer and the supporting plate whose diameters are about 150 mm are inserted into the hole whose diameter is 160 mm.

Also, this technique uses an epoxy resin or the like as an adhesive for attaching a supporting plate to a semiconductor wafer. Since the rigidity of an epoxy resin decreases with heating, displacement easily occurs after positioning is performed.

In order to solve the above-mentioned problems, an object of the present invention is to provide an attaching device and an attaching apparatus for a supporting plate, and an attaching method for a supporting plate which make it possible to reliably align a substrate with a supporting plate when the diameters thereof are the same, and easily correct the alignment even after the supporting plate is attached to the substrate.

SUMMARY OF THE INVENTION

In order to solve the above-mentioned problems, according to the present invention, there is provided an attaching device which attaches a supporting plate to a surface of a substrate with an adhesive comprising a mounting plate for mounting a substrate thereon, a pressing plate for pressing a supporting plate onto a substrate, and a pair of alignment members, wherein the pair of alignment members are arranged to freely move back and forth in a horizontal direction, and blades for supporting a lower surface of the periphery of the supporting plate and pushing members for performing positioning in a state where the supporting plate is superposed on the substrate are provided at the tip ends of the alignment members.

Since the attaching device for a supporting plate of the present invention has a mounting plate for mounting a substrate thereon, a pressing plate for pressing a supporting plate onto a substrate, and a pair of alignment members arranged to freely move back and forth in a horizontal direction and provided with blades for supporting a lower surface of the periphery of the supporting plate and pushing members for performing positioning in a state where the supporting plate is superposed on the substrate, it is possible to reliably align a substrate and a supporting plate when the diameters thereof are the same. Preferred examples of the pushing member include a roller.

Incidentally, the same diameters refer to a state where the diameters are exactly the same and also a state where the dimension of the semiconductor wafer overreaching the substrate is too small to be pinched by a pinching device.

Preferably, the mounting plate and the pressing plate are located within a chamber which is connected to a vacuum source so as to prevent air from entering between the substrate and the supporting plate. The alignment members are arranged to move back and forth by penetrating the side walls of the chamber.

Also, if the mounting plate doubles as a hot plate, it is possible to effectively release gas from the adhesive. In this instance, if the pressing plate is allowed to approach the hot plate for heating in advance, a heating means is not required for both of the upper portion and the lower portion. In addition, if a temperature-adjusting mechanism is provided in both the upper and lower portions, it is possible by properly adjusting the mechanism to improve the gas releasing effect and reduce warpage of the substrate, which might occur after attachment.

Also, a supporting pin for a substrate may be provided so as to move up and down with respect to the top surface of the mounting plate through a vertical penetrating hole formed in the mounting plate.

According to the present invention, there is also provided an attaching method for attaching a supporting plate to a surface of a substrate with an adhesive, comprising the steps of applying an adhesive to the surface of the substrate, heating and thereafter cooling the substrate, positioning centers of the substrate and the supporting plate to coincide with each other, and forming a layered structure by pushing the supporting plate onto the substrate in a pressure-reduced atmosphere.

Incidentally, the above-described attaching device is not necessarily used in this attaching method but can be.

Since the attaching method of the present invention comprises the steps of applying an adhesive to the surface of the substrate, heating and thereafter cooling the substrate, positioning centers of the substrate and the supporting plate to coincide with each other, and forming a layered structure by pushing the supporting plate onto the substrate in a pressure-reduced atmosphere, it is possible to finely adjust the alignment of the supporting plate and the semiconductor wafer when attached by applying an adhesive to the surface of the substrate, heating and thereafter cooling the substrate.

According to the present invention, there is also provided an attaching apparatus for attaching a supporting plate to a surface of a substrate with an adhesive, comprising a transfer robot, cassettes for storing untreated substrates and a supporting plate, an applying device which applies a treatment liquid to a surface of the substrate on which a circuit is formed, a heat treatment device which heats a coating film, a cooling device which cools the coating film, a positioning device which positions a substrate and a supporting plate, and the above-described attaching device, which are provided so as to surround the transfer robot.

Since the attaching apparatus of the present invention has at least a transfer robot, cassettes for storing untreated substrates and a supporting plate, an applying device which applies a treatment liquid to a surface of the substrate on which a circuit is formed, a heat treatment device which heats a coating film, a cooling device which cools the coating film, a positioning device which positions a substrate and a supporting plate, and the above-described attaching device, in addition to the above-described function of the attaching device, it is possible to efficiently perform a series of processes for attaching a supporting plate in a single apparatus, and also simplify the structure of the apparatus.

It is also possible to reduce the required time for transferring the substrate because the processing devices are not separately provided, and also reduce the time for the attaching process.

DETAILED DESCRIPTION OF THE PREFERRED EMBODIMENTS

Figure 1:
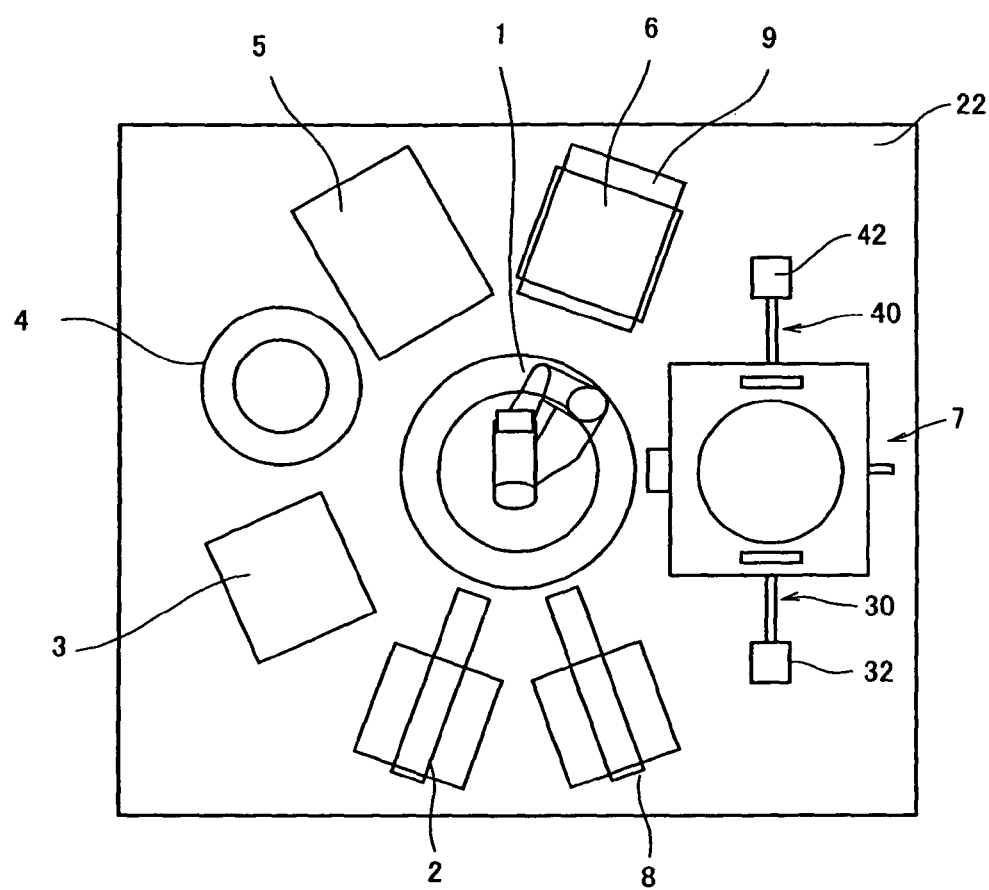
FIG. 1 is a schematic plan view showing an embodiment of an attaching apparatus according to the present invention.
Figure 3:
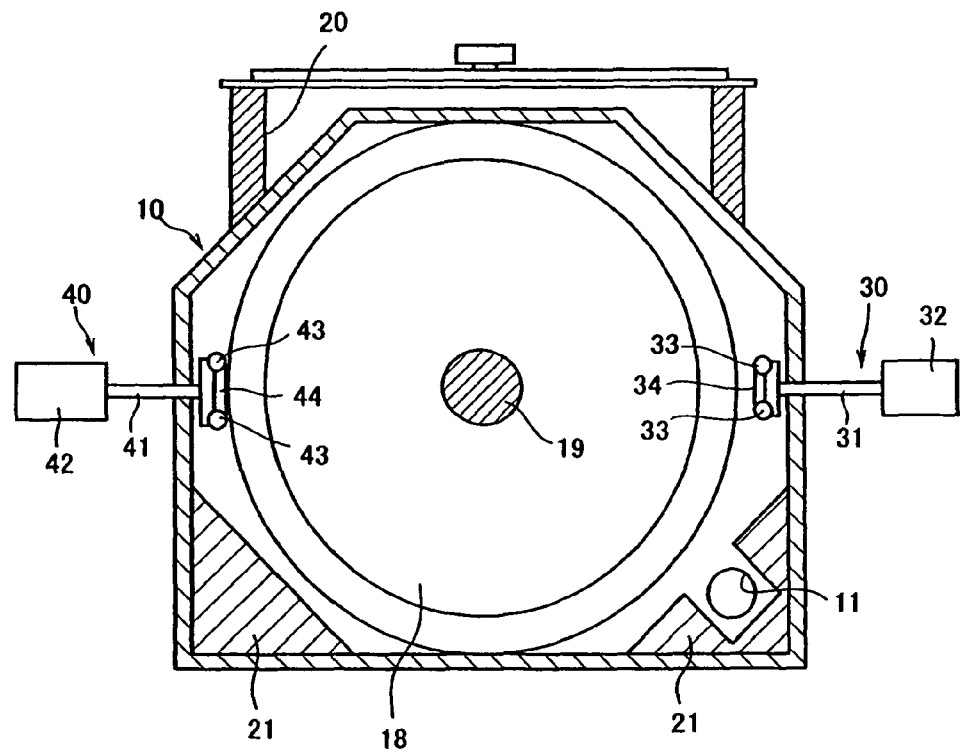
FIG. 3 is a cross-sectional view taken from A-A direction of FIG. 2.
Figure 4:
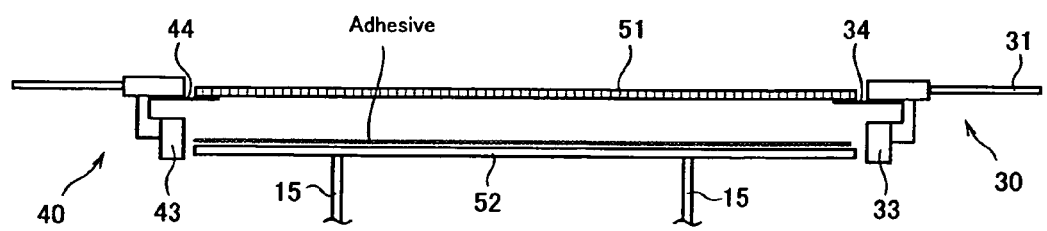
FIG. 4 is a side view of an alignment member.
Figure 5:
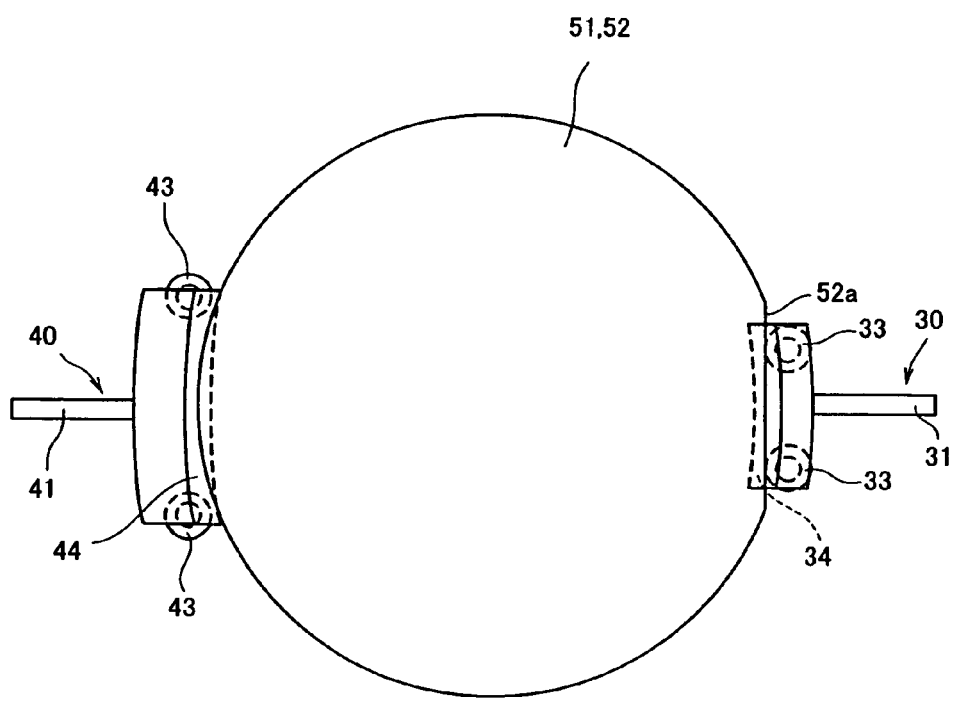
FIG. 5 is a plan view of the alignment member.

Embodiments of the present invention will be described below with reference to the attached drawings. FIG. 1 is a schematic plan view showing an embodiment of an attaching apparatus according to the present invention, FIG. 2 is a front cross-sectional view of an attaching device shown in FIG. 1, FIG. 3 is a cross-sectional view taken from A-A direction of FIG. 2, FIG. 4 is a side view of an alignment member, and FIG. 5 is a plan view of the alignment member.

In an attaching apparatus 22 of the present embodiment shown in FIG. 1, a transfer robot 1 is provided. Also, a wafer cassette 2, an applying device 4, and a heat treatment device (for example, hot plate) 5, a cooling device (for example, cooling plate), an attaching device 7, and a supporting plate cassette 8 are provided to surround the transfer robot 1. There are a positioning device 3 for positioning a semiconductor wafer before application and a positioning device 9 for positioning a supporting plate before attachment.

Figure 2:
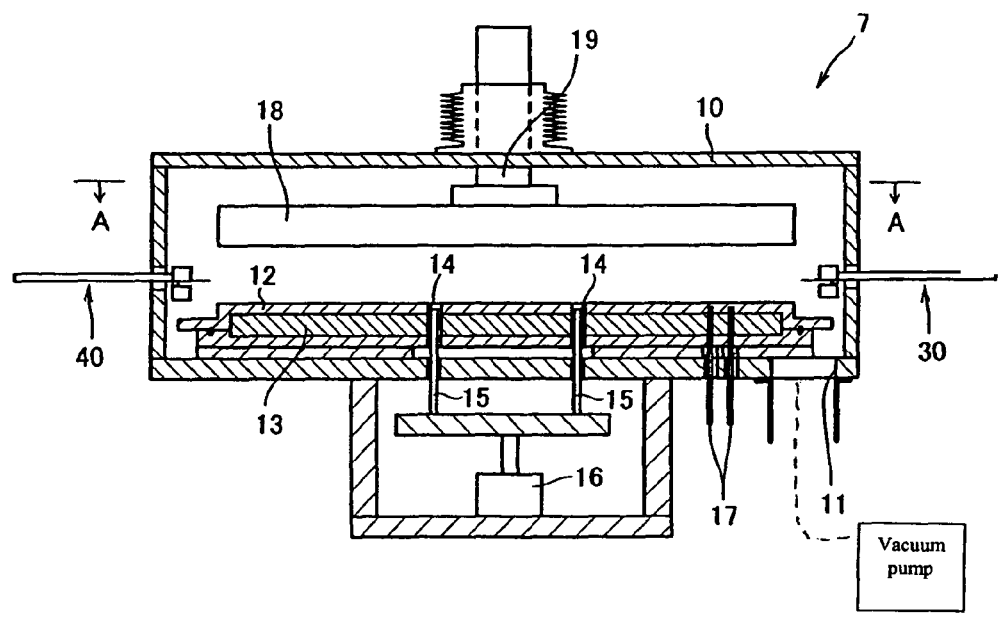
FIG. 2 is a front cross-sectional view of an attaching device shown in FIG. 1.

As shown in FIG. 2, the attaching device 7 is provided with a chamber 10. An opening 11 connected to a vacuum pump is formed in the bottom of the chamber 10. A mounting plate 12 is provided on the bottom surface of the chamber 10. The lower portion of the mounting plate 12 is a hot plate 13. A penetrating hole 14 is formed in the thickness direction of the mounting plate 12, and a pin 15 is inserted into the penetrating hole 14.

The pin 15 extends downward so as to penetrate the bottom of the chamber 10 in an airtight and slidable manner. The lower end of the pin 15 is fixed to a cylinder unit 16. There is also provided a thermocouple 17.

A pressing plate 18 is provided in the ceiling portion of the chamber 10. A shaft 19 of the pressing plate 18 extends upward so as to penetrate the ceiling portion in an airtight and slidable manner, and the pressing plate 18 can be elevated and lowered by a driving unit which is not shown in the drawing. The pressing plate 18 is coupled to the shaft 19 by a ball joint so as to accept the thickness or inclination of the semiconductor wafer and the supporting plate.

Since the semiconductor wafer is heated at the time of pressing, if the pressing plate 18 is made of a material having a high thermal expansion coefficient, the pressing plate is distorted by heat, which makes it impossible to perform attachment with high accuracy. Thus, it is preferable to use a material having a low thermal expansion coefficient such as synthetic quartz, SiC, alumina or the like.

An opening 20 for inserting and taking a semiconductor wafer as a substrate and a supporting plate is formed in the front of the chamber 10 as shown in FIG. 3. A volume reducing block 21 is provided inside the chamber 10 opposed to the opening 20 so as to reduce the pressure to a desired pressure in a short period of time.

A pair of alignment members 30 and 40 are provided in both ends of the chamber 10. Shafts 31 and 41 of the alignment members 30 and 40 penetrate the side walls of the chamber 10, and the outer ends of the shafts 31 and 41 are coupled to cylinder units 32 and 42 so as to move back and forth in an airtight and slidable manner driven by the cylinder units 32 and 42.

Blades 34 and 44, and a pair of rollers 33 and another pair of rollers 43 are provided in the tip ends of the shafts 31 and 41 of the alignment members 30 and 40, respectively. The blades 34 and 44 serve to support the lower surface of the periphery of the supporting plate 51. The thickness of the rollers 33 and 43 is larger than the thickness of the semiconductor wafer 52 in a state where the adhesive layer is applied thereon to be contacted with the lower surface of the supporting plate 51, that is, the thickness of the semiconductor wafer and the adhesive layer.

The distances between the rollers 33 and between the rollers 43 are adjusted to be smaller than the length of an orientation flat 52a of the semiconductor wafer 52 in the alignment member 30.

The supporting plate 51 may be a glass plate, a ceramic plate, or a resin plate. Examples of ceramic plates include alumina and SiC. Examples of resin plates include plyimide, PET, and polyethylene naphthalate. As for the shape of the supporting plate 51, a simple disc shape (with a straight portion which corresponds to an orientation flat), a shape in which a number of penetrating holes are formed in the thickness direction, and a shape in which a groove is formed in the surface to distribute a solvent are possible.

The applying device 4 serves to apply an adhesive onto a surface of a semiconductor wafer. The heat treatment device 5 serves to heat the adhesive applied onto the semiconductor wafer. The cooling device 6 enables fine positioning at the time of attaching the supporting plate and the semiconductor wafer by cooling the heated adhesive on the semiconductor wafer. Incidentally, the above-described devices may each be a multi-stage type.

Next, processes for attaching the supporting plate 51 and the semiconductor wafer 52 to each other by using the above-described attaching apparatus 22 will be explained.

A single semiconductor wafer 52 is taken out of the wafer cassette 2 by the transfer robot 1. After positioning the semiconductor wafer 52 is performed in the positioning device 3, an adhesive is applied onto the top surface of the semiconductor wafer 52 by the applying device 4.

Next, the semiconductor wafer 52 is heated by a hot plate as the heating device 5, and thereafter transferred to the cooling device 6 by the transfer robot 1. The adhesive whose rigidity has been decreased by heating is cured to some extent in the cooling device 6, so that the alignment of the supporting plate 51 can be adjusted easily.

Figure 6:
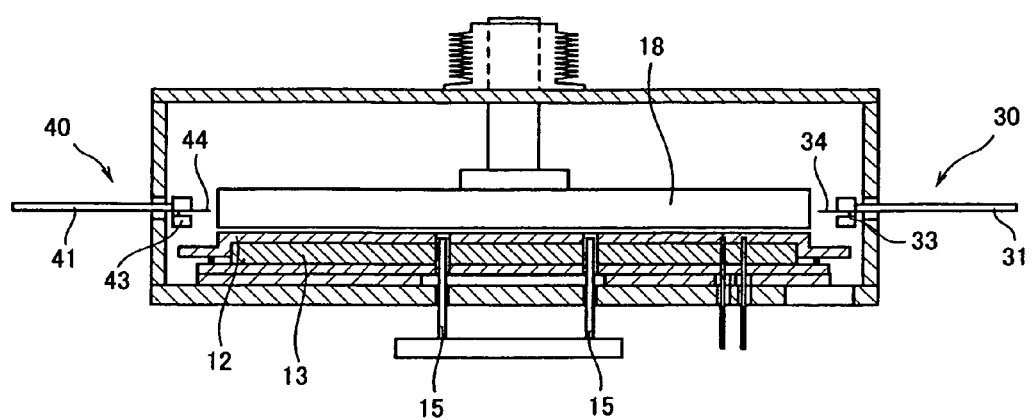
FIG. 6 shows the inside of the attaching device at the start of operation.

In this instance, the attaching device 7 is a state shown in FIG. 6. Specifically, the top end of the pin 15 is lower than the top surface of the mounting plate 12, and the lower surface of the pressing plate 18 is lowered to a position near the top surface of the mounting plate 12 so as to be heated by the hot plate 13. The alignment members 30 and 40 are in a position of moving backward.

Figure 7:
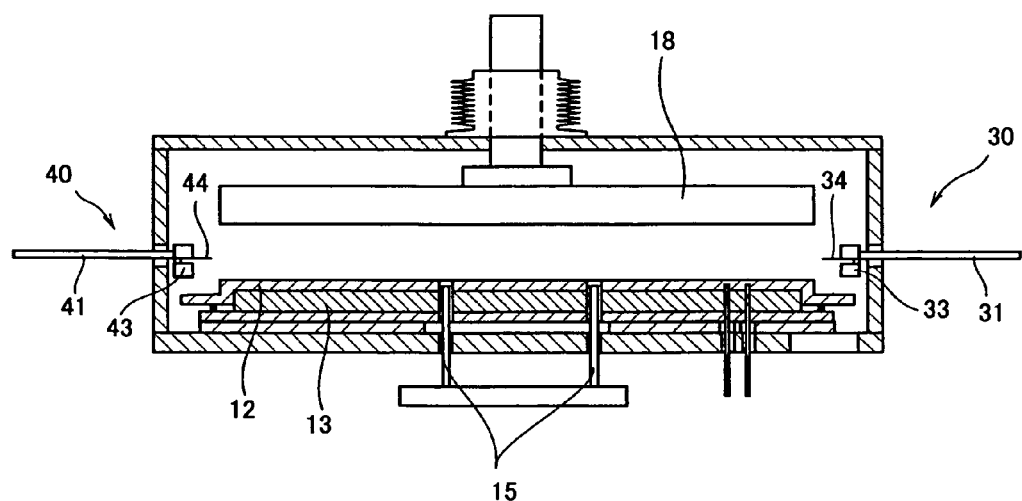
FIG. 7 shows the inside of the attaching device in a state where a pressing plate is elevated after starting the operation.
Figure 8:
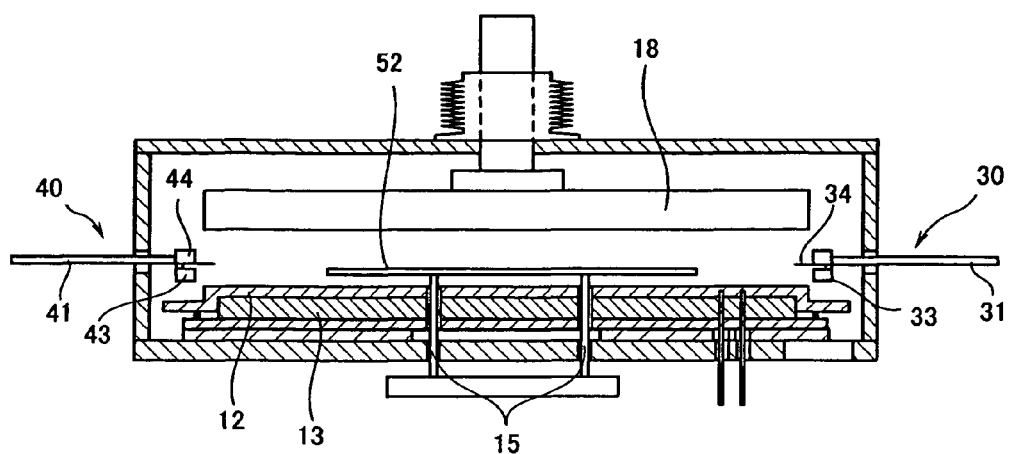
FIG. 8 shows the inside of the attaching device in a state where the alignment member moves forward to the position for receiving a supporting plate.

Next, the pressing plate 18 is elevated as shown in FIG. 7, and the pin 15 is elevated by driving the cylinder unit 16 as shown in FIG. 8. The semiconductor wafer 52 whose top surface has been coated with an adhesive is transferred into the chamber 10 via the opening 20 with the transfer robot 1 and passed to the pin 15.

Figure 9:
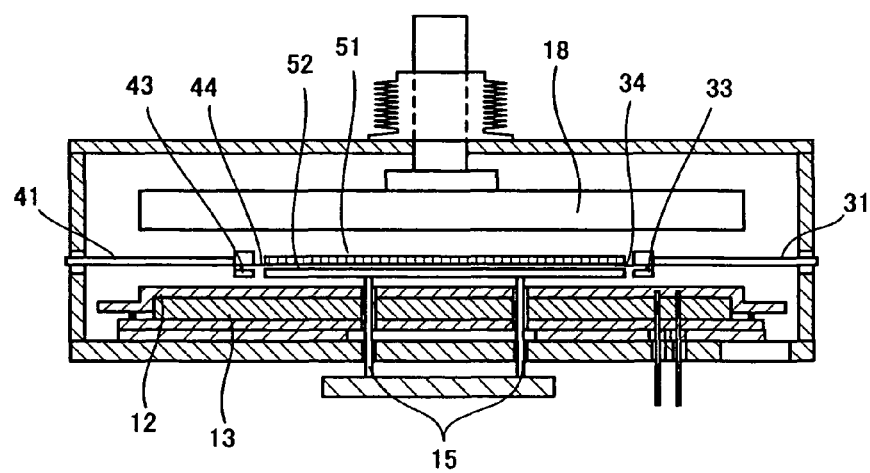
FIG. 9 shows the inside of the attaching device in a state where a semiconductor wafer and a supporting plate are transferred inside a chamber.

Next, the alignment members 30 and 40 are moved forward by driving the cylinder units 32 and 42 and stopped in a predetermined position as shown in FIG. 9. The supporting plate 51 is taken out of the supporting plate cassette 8, transferred into the chamber 10 via the opening 20, and passed to the blades 34 and 44 of the alignment members 30 and 40 by the transfer robot 1. Positioning of the supporting plate 51 before attachment can be performed in the positioning device 9.

Figure 10:
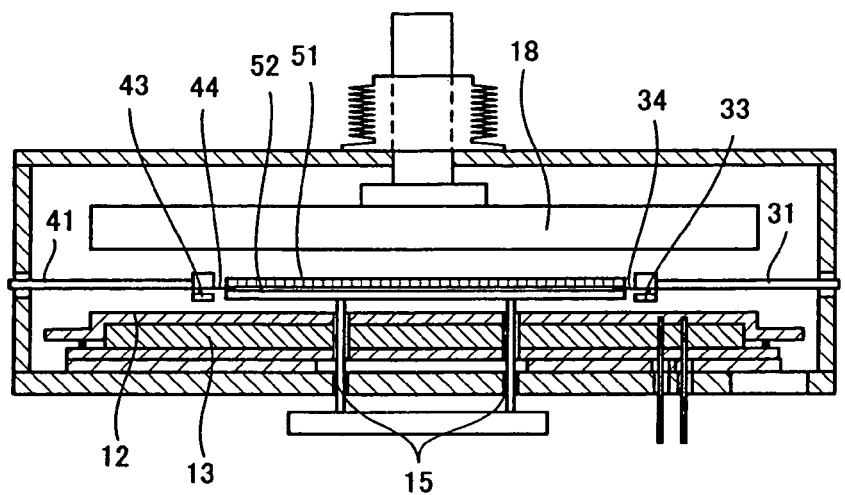
FIG. 10 shows the inside of the attaching device in a state where a semiconductor wafer and a supporting plate are superposed.

Next, the pin 15 is further elevated so as to bring the adhesive layer on the semiconductor wafer 52 into contact with the lower surface of the supporting plate 51 as shown in FIG. 10, and the alignment members 30 and 40 are moved backward at the same time. This state is shown in FIG. 11.

Figure 11:
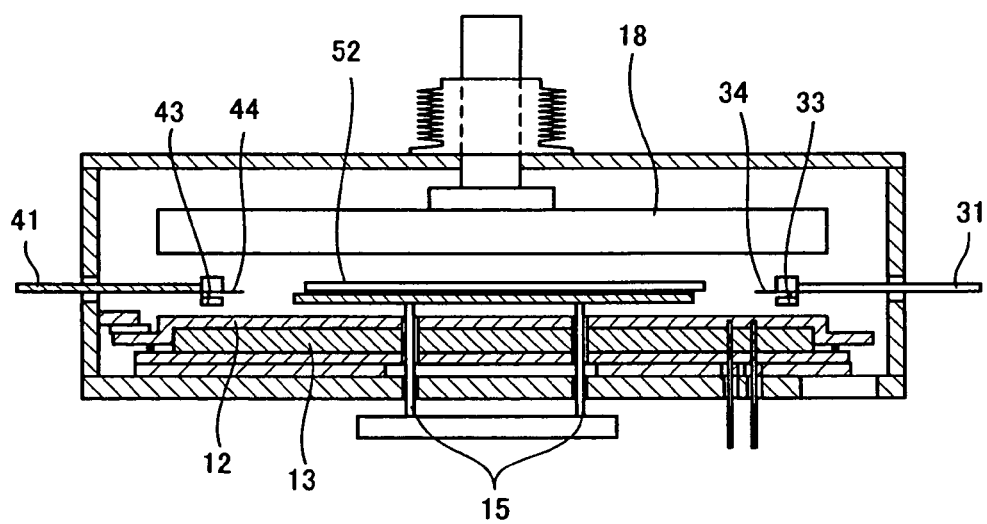
FIG. 11 shows the inside of the attaching device in a state where the alignment member moves backward from the state shown in FIG. 10.

As clearly seen from FIG. 11, slight displacement occurs between the supporting plate 51 and the semiconductor wafer 52 when the alignment members 30 and 40 are moved backward.

Figure 12:
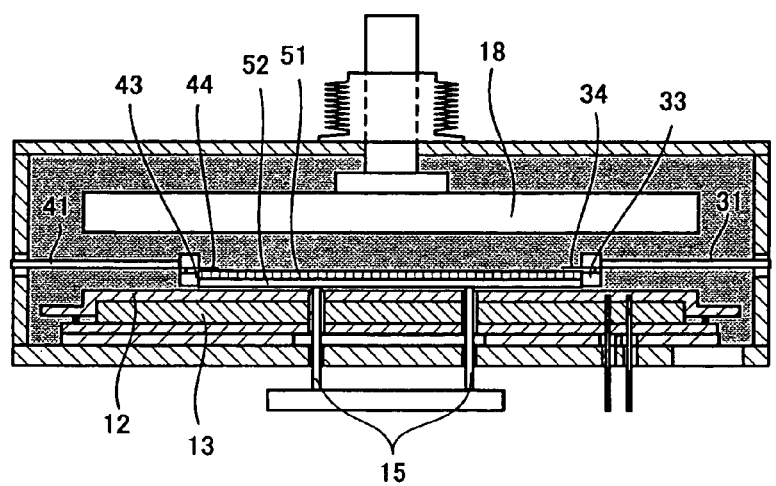
FIG. 12 shows the inside of the attaching device in a state where alignment is performed while a semiconductor wafer and a supporting plate are superposed.

In order to correct this displacement, the pin 15 is slightly lowered such that the height position of the layered structure (the supporting plate 51 and the semiconductor wafer 52) is adjusted to be in the same level as the rollers 33 and 43 of the alignment members 30 and 40. The alignment members 30 and 40 are moved forward to a predetermined position as shown in FIG. 12.

With this, the centers of the supporting plate 51 and the semiconductor wafer 52 are allowed to coincide with each other. In addition, since the distances between the rollers 33 and between the rollers 43 are adjusted to be smaller than the length of the orientation flat 52a of the semiconductor wafer 52, displacement of the supporting plate orientation flat can be corrected at the same time by adjusting the rollers 33 and 43 to be located in the orientation flat 52a.

Figure 13:
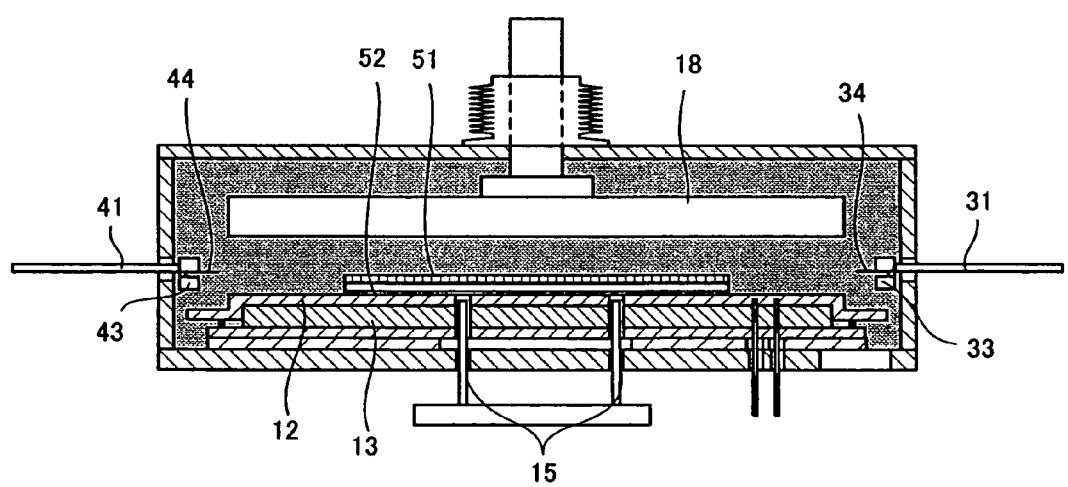
FIG. 13 shows the inside of the attaching device in a state where a layered structure after alignment is mounted on a mounting plate.

The above-described alignment is performed in a state where the pressure inside the chamber 10 is reduced (indicated by dark shading). Next, as shown in FIG. 13, after the alignment members 30 and 40 are moved backward, the pin 15 is lowered and the layered structure of the supporting plate 51 and the semiconductor wafer 52 is mounted on the heated mounting plate 12. The layered structure is heated so as to remove gas contained in the adhesive.

Figure 14:
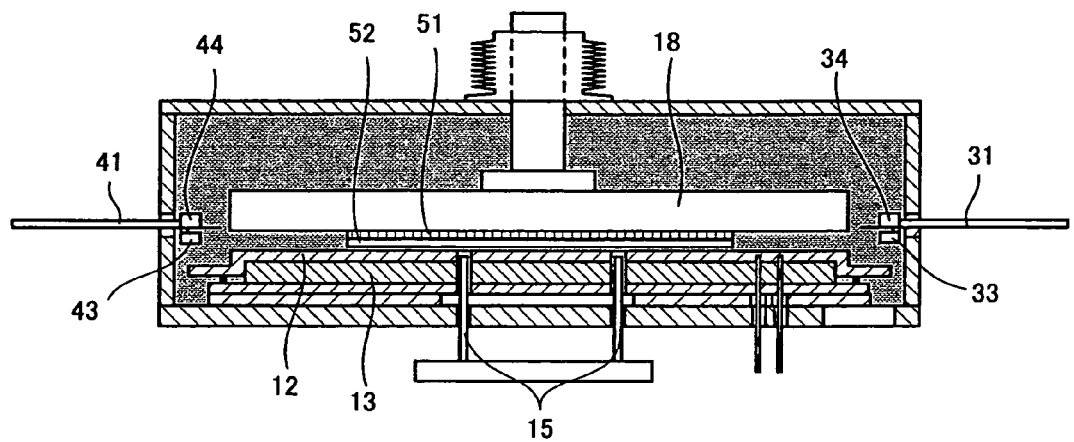
FIG. 14 shows the inside of the attaching device in a state where a supporting plate is pushed onto a semiconductor wafer by lowering a pressing plate.
Figure 15:
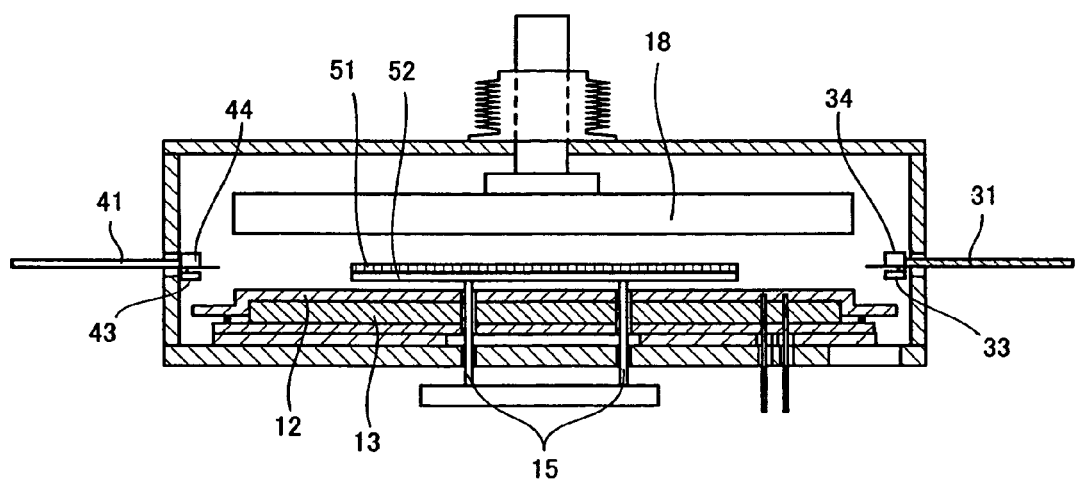
FIG. 15 shows the inside of the attaching device in a state where the pressing plate is elevated after attachment.

Next, as shown in FIG. 14, the pressing plate 18 is lowered so as to press the supporting plate 51 and the semiconductor wafer 52 toward the mounting plate 12. In this way, the layered structure of the supporting plate 51 and the semiconductor wafer 52 is formed. Next, as shown in FIG. 15, the pressing plate 18 is elevated, the pin 15 is also elevated, and the pressure-reduced state is released.

The layered structure of the supporting plate 51 and the semiconductor wafer 52 undergoes a subsequent thinning process using a grinder.

Incidentally, the semiconductor wafer 52 is transferred first in the present embodiment. However, the supporting plate 51 may be transferred first, and the semiconductor wafer 52 may be transferred next.

Since the attaching apparatus 22 of the present embodiment comprises the transfer robot 1, and the cassettes, the applying device 4, the heat treatment device 5, the cooling device 6, the positioning devices 3 and 9 for the semiconductor wafer 52 and the supporting plate 51, respectively, and the attaching device 7 which surround the transfer robot 1, it is possible to efficiently perform a series of processes for attaching the supporting plate 51 to the semiconductor wafer 52 in a single apparatus, and simplify the structure of the apparatus.

Since the attaching method comprises the steps of applying an adhesive to the surface of the semiconductor wafer 52, heating and thereafter cooling the semiconductor wafer 52, it is possible to cure the adhesive whose rigidity has been decreased by heating, and finely adjust positioning of the supporting plate and the semiconductor wafer after attachment, which is difficult according to a conventional technique because the adhesive is softened by heating. Also, a conventional large-scale positioning apparatus is not required.

Additionally, the attaching apparatus 22 of the present embodiment can be used for an image sensor. In this instance, since heating for a long period of time is required, an oven (a multistage oven) is used as the heat treatment device 5 instead of the hot plate. The other structures are substantially the same as above.

In this attaching apparatus, the same function can be achieved as in the above-described attaching apparatus 22. This attaching apparatus has the advantage that the processing capacity can be increased and the processing time can be reduced by using the multistage oven.

Also, the attaching apparatus 22 of the above-described embodiment may include an attaching device for a sheet (for example, a PI sheet made of polyimide).

The present invention is not limited to the above-mentioned embodiments, and other various structures are possible within the scope of the present invention.

EFFECT OF THE INVENTION

According to the attaching device of the present invention, it is possible to accurately perform alignment when the diameters of a substrate and a supporting plate are substantially the same.

According to the attaching method of the present invention, it is possible to finely correct the alignment after attachment.

According to the attaching apparatus of the present invention, it is possible to efficiently perform attachment of the supporting plate and also simplify the structure.

Accordingly, the present invention is suitable for attaching a supporting plate to a substrate, and an attaching apparatus having high performance and reliability can be achieved.

What is claimed is:

1. An attaching device for attaching a supporting plate to a surface of a substrate with an adhesive comprising: a mounting plate for mounting a substrate thereon; a pressing plate for pressing a supporting plate onto a substrate with adhesive between the substrate and the supporting plate; and a pair of alignment members, wherein the pair of alignment members are arranged to freely move back and forth in a horizontal direction, and blades for supporting a lower surface of the periphery of the supporting plate and pushing members for performing positioning in a state where the supporting plate is superposed on the substrate are provided at the tip ends of the alignment members, wherein each of said pushing members includes a pair of rollers, and a thickness of the rollers is larger than a combined thickness of the substrate and the adhesive, wherein the blades exclusively support the supporting plate before the supporting plate is adhesively bonded to the substrate; wherein the mounting plate and the pressing plate are located within a chamber which is connected to a vacuum source, and the alignment members are arranged to move back and forth by penetrating the side walls of the chamber.

2. The attaching device according to claim 1, wherein the mounting plate has a temperature-adjusting mechanism.

3. The attaching device according to claim 1, wherein the pressing plate has a temperature-adjusting mechanism.

4. The attaching device according to claim 1, wherein a supporting pin for supporting the substrate is provided so as to move up and down with respect to the top surface of the mounting plate through a vertical penetrating hole formed in the mounting plate.

5. An attaching apparatus for attaching a supporting plate to a surface of a substrate with an adhesive, comprising:
   a transfer robot;
   cassettes for storing an untreated substrate and a supporting plate;
   an applying device which applies a treatment liquid to a surface of the substrate on which a circuit is formed;
   a heat treatment device which heats a coating film;
   a cooling device which cools the coating film;
   a positioning device which positions a substrate and a supporting plate; and
   the attaching device of claim 1,
   the cassettes, the applying device, the heat treatment device, the cooling device, the positioning device, the attaching device being provided so as to surround the transfer robot.

6. The attaching apparatus according to claim 5, wherein the mounting plate and the pressing plate are located within a chamber which is connected to a vacuum source, and the alignment members are arranged to move back and forth by penetrating the side walls of the chamber.

7. The attaching apparatus according to claim 5, wherein the mounting plate has a temperature-adjusting mechanism.

8. The attaching apparatus according to claim 5, wherein the pressing plate has a temperature-adjusting mechanism.

9. The attaching apparatus according to claim 5, wherein a supporting pin for supporting the substrate is provided so as to move up and down with respect to the top surface of the mounting plate through a vertical penetrating hole formed in the mounting plate.

10. The attaching device according to claim 1, wherein the pushing members are also disposed at the tip ends of the pushing members but at a different vertical level than the blades, and the pushing members do not engage the supporting plate when the supporting plate is supported by the blades.

11. The attaching device according to claim 1, further comprising a mechanism for vertically moving the substrate relative to the alignment members.

12. The attaching device according to claim 1, wherein the pushing members perform positioning of the substrate and the supporting plate when the supporting plate is not supported by the blades.

13. The attaching apparatus according to claim 5, wherein the pushing members are also disposed at the tip ends of the pushing members but at a different vertical level than the blades, and the pushing members do not engage the supporting plate when the supporting plate is supported by the blades.

14. The attaching apparatus according to claim 5, wherein the pushing members perform positioning of the substrate and the supporting plate when the supporting plate is not supported by the blades.

* * * * *